United States Patent
Jain et al.

(10) Patent No.: US 9,508,405 B2
(45) Date of Patent: Nov. 29, 2016

(54) METHOD AND CIRCUIT TO ENABLE WIDE SUPPLY VOLTAGE DIFFERENCE IN MULTI-SUPPLY MEMORY

(71) Applicant: STMicroelectronics International N.V., Amsterdam (NL)

(72) Inventors: Piyush Jain, Ghaziabad (IN); Vivek Asthana, Greater Noida (IN); Naveen Batra, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 135 days.

(21) Appl. No.: 14/045,589

(22) Filed: Oct. 3, 2013

(65) Prior Publication Data
US 2015/0098267 A1    Apr. 9, 2015

(51) Int. Cl.
  *G11C 7/12*   (2006.01)
  *G11C 11/419*  (2006.01)
  *G11C 5/14*   (2006.01)

(52) U.S. Cl.
  CPC .............. *G11C 7/12* (2013.01); *G11C 11/419* (2013.01); *G11C 5/14* (2013.01)

(58) Field of Classification Search
  USPC ........................................................ 365/154
  See application file for complete search history.

(56) References Cited

U.S. PATENT DOCUMENTS

| | | | | |
|---|---|---|---|---|
| 6,130,846 | A * | 10/2000 | Hori | G11C 7/22 365/203 |
| 8,279,659 | B2 | 10/2012 | Cho et al. | |
| 8,370,557 | B2 | 2/2013 | Dama et al. | |
| 2004/0239368 | A1 | 12/2004 | Nautiyal et al. | |
| 2005/0024928 | A1 | 2/2005 | Cummings et al. | |
| 2006/0164904 | A1 * | 7/2006 | Saleh | G11C 16/24 365/226 |
| 2010/0156480 | A1 * | 6/2010 | Lee | G11C 7/1096 327/153 |
| 2010/0182865 | A1 * | 7/2010 | Wu | G11C 5/145 365/226 |
| 2011/0026309 | A1 * | 2/2011 | Kumar | G11O 5/145 365/154 |
| 2011/0149662 | A1 * | 6/2011 | Batra | G11C 7/12 365/189.16 |
| 2011/0163801 | A1 | 7/2011 | Chua-Eoan | |
| 2011/0188326 | A1 * | 8/2011 | Lee | G11C 7/00 365/189.11 |
| 2013/0135944 | A1 * | 5/2013 | Braceras | G11C 5/147 365/189.07 |
| 2014/0010000 | A1 * | 1/2014 | Taufique | G11C 11/417 365/154 |
| 2014/0198594 | A1 * | 7/2014 | McCombs | G11C 7/12 365/203 |
| 2015/0063007 | A1 * | 3/2015 | Choi | G11C 11/419 365/154 |

OTHER PUBLICATIONS http://en.wikipedia.org/wiki/Inverter_(logic_gate), accessed May 13, 2015 http://en.wikipedia.org/wiki/Static_random-access_memory, accessed May 13, 2015.*
"System on a chip," Wikipedia, Jul. 30, 2013, 4 pages.

\* cited by examiner

*Primary Examiner* — Anthan Tran
*Assistant Examiner* — Mushfique Siddique
(74) *Attorney, Agent, or Firm* — Slater Matsil, LLP

(57) ABSTRACT

A method and apparatus for operating a memory device with wider difference in array and periphery voltage is presented. The memory device includes a bit line, a complementary bit line, a memory cell, a first pre-charge circuit, and a second pre-charge circuit. The memory cell, the first pre-charge circuit, and the second pre-charge circuit are coupled between the bit line and the complementary bit line. The first pre-charge circuit is configured to pre-charge the bit line and the complementary bit line to a first voltage level. The second pre-charge circuit is configured to pre-charge the bit line and the complementary bit line to a second voltage level that is different than the first voltage level. In some examples, two precharge circuits are configured to operate such that memory access is ensured to be static noise margin safe even under wider difference between two voltage levels.

31 Claims, 10 Drawing Sheets

METHOD AND CIRCUIT TO ENABLE WIDE SUPPLY VOLTAGE DIFFERENCE IN MULTI-SUPPLY MEMORY

TECHNICAL FIELD

The present invention relates generally to memory devices and, in particular embodiments, to a method and circuit for pre-charging a memory device.

BACKGROUND

Static Random Access Memory (SRAM) is a commonly used type of memory device that includes one or more memory cells. A typical SRAM cell is made up of six metal-oxide-semiconductor field-effect transistors (MOSFETs). Each memory cell in the SRAM stores information using four of the transistors that form two cross-coupled inverters. This memory cell generally operates in two stable states, denoted as 0 and 1. Two additional access transistors control the access to the memory cell during read and write operations.

Other SRAM cells may use more than four transistors per bit. For example, SRAM used in central processing unit (CPU) caches may use eight transistors, 10 transistors, or more per bit. In some memory devices, SRAM cells may be configured in an array.

An example of a typical 6T SRAM cell circuit is shown in FIG. 1. As shown in FIG. 1, the memory cell includes transistors $M_1$, $M_2$, $M_3$, and $M_4$ forming two inverters. In particular, PMOS transistors $M_1$ and $M_3$ serve as pull-up transistors and NMOS transistors $M_2$ and $M_4$ serve as pull-down transistors. Access to the memory cell is enabled by the word line WL, which controls the two access transistors $M_5$ and $M_6$. Transistors $M_5$ and $M_6$ control whether the memory cell should be connected to the bit lines BL and BLB. The SRAM cell of FIG. 1 has three states, standby (i.e., idle), read, and write.

SUMMARY OF THE INVENTION

In one embodiment, a memory device includes a bit line, a complementary bit line, a memory cell, a first pre-charge circuit, and a second pre-charge circuit. The memory cell is coupled between the bit line and the complementary bit line. The first pre-charge circuit is coupled between the bit line and the complementary bit line and is configured to pre-charge the bit line and the complementary bit line to a first voltage level. The second pre-charge circuit is also coupled between the bit line and the complementary bit line. The second pre-charge circuit is configured to pre-charge the bit line and the complementary bit line to a second voltage level that is different than the first voltage level.

In another embodiment, an integrated circuit includes an array of memory cells, peripheral circuitry adjacent the memory cells, an array voltage node, a peripheral voltage node, and control circuitry. The array of memory cells is arranged in rows and columns. Each column of memory cells is coupled to a respective bit line and each row of memory cells is coupled to a respective word line. The array voltage node is coupled to provide power to the array, while the peripheral voltage node is coupled to provide power to the peripheral circuitry. The control circuitry is configured to access a selected memory cell in the array and keep the bit line of the selected memory cell pre-charged to the peripheral voltage and then, in response to an access request, to be pre-charged to the array voltage.

Another embodiment includes a system on a chip. The system on chip includes processing circuitry, a plurality of static random access memory cells arranged in rows and columns, a first pre-charge circuit for each column, a second pre-charge circuit, and a control circuit. The processing circuitry is powered by a peripheral voltage that is configured to be set to different voltage levels in different modes. Each column of SRAM cells is coupled between a respective bit line and complementary bit line and each row of SRAM cells is coupled to a respective word line. Each SRAM cell is powered by an array voltage. For each row, a first pre-charge circuit is coupled between the bit line and the complementary bit line and is configured to pre-charge the bit line and the complementary bit line to the peripheral voltage. The second pre-charge circuit is coupled between the bit line and the complementary bit line and is configured to pre-charge the bit line and the complementary bit line to the array voltage. The control circuit is configured to receive an access request of a selected memory cell that is coupled to a selected bit line, a selected complementary bit line, and a selected word line. The control circuit is further configured such that when the peripheral voltage is less than the array voltage by more than a margin, the control circuit pre-charges the selected bit line and selected complementary bit line to the peripheral voltage. The control circuit may then pre-charge the selected bit line and selected complementary bit line to the array voltage and subsequently activate the selected word line. In another embodiment, bit lines are precharged above periphery voltage only by that much amount which ensures a safe bitcell operation. This does not necessitate the bit lines to be precharged to complete array voltage. The control circuit is further configured such that when the peripheral voltage is not less than the array voltage by more than the margin, the control circuit keeps the selected bit line and the selected complementary bit line precharged to the periphery voltage and then activates the selected word line.

In still another embodiment, a method of operating a memory is provided. A bit line is pre-charged to a first voltage level. In response to an access request, the bit line is precharged to a second voltage level that is different than the first voltage level. After pre-charging the bit line to the second voltage level, a memory cell coupled to the bit line is accessed.

BRIEF DESCRIPTION OF THE DRAWINGS

For a more complete understanding of the present invention, and the advantages thereof, reference is now made to the following descriptions taken in conjunction with the accompanying drawings, in which:

FIG. 2, which includes

FIG. 7, which includes

FIG. 8, which includes

FIG. 10, with includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described in the context of SRAM memory. In embodiments of the invention, the memory can be implemented in a system on a chip device. In other embodiments the memory system of the present invention can be implemented as a standalone memory or in other contexts. It is understood that while discussed with respect to memory, concepts of the present invention can be applied to other devices. For example, a device that operates in a dual voltage system and has a pre-charge node can benefit from concepts described herein.

Figure 2A:
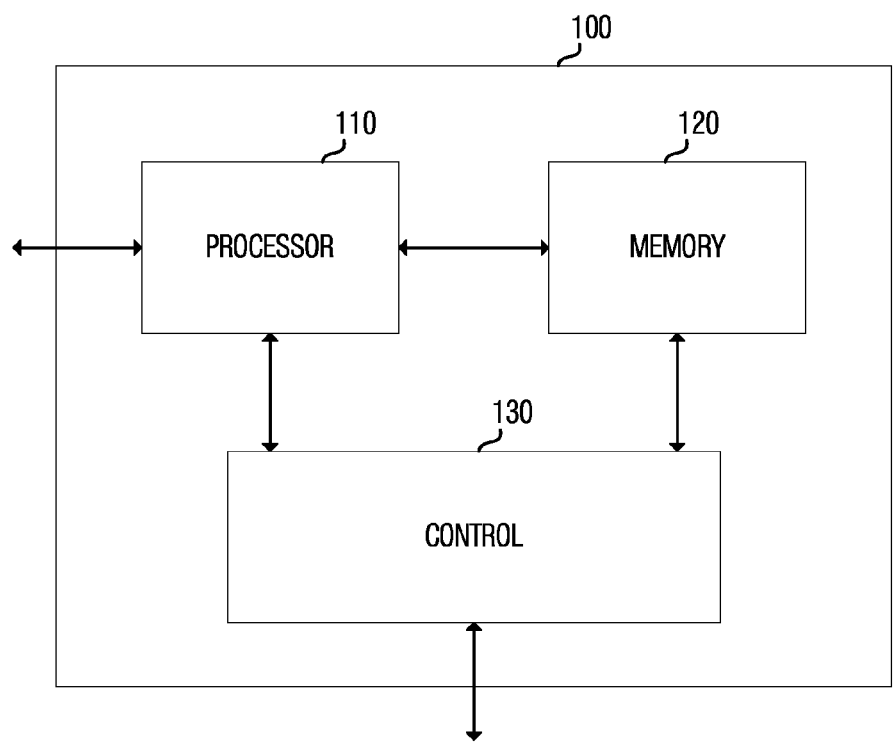
FIGS. 2A and 2B, is an illustration of a system on a chip that includes a memory system of the present invention.
Figure 2B:
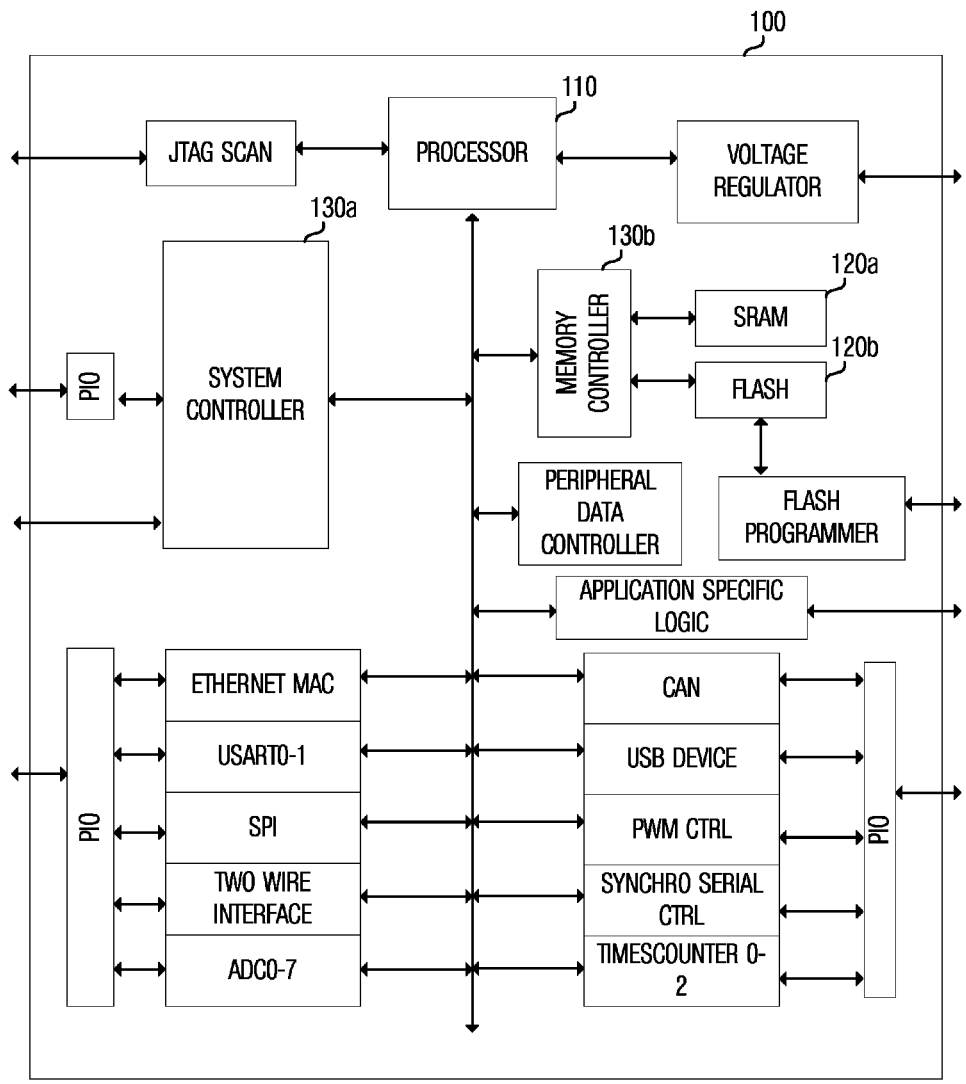

FIG. 2, which includes FIGS. 2A and 2B, illustrates a system on a chip (SoC) that includes a memory system of the present invention. An SoC is an integrated circuit that integrates multiple components of an electronic system into a single chip. A simplified example of a SoC device 100 is shown in FIG. 2A. This example shows a processor 110, a memory (e.g., SRAM) 120 and control circuitry 130. Each of these elements is interconnected to perform the desired functions of the SoC device 100. For example, the SoC device 100 can include a microprocessor core and one or more memory blocks, timing sources, external interfaces (e.g., USB, Ethernet, etc.), analog interfaces, voltage regulators, and power management circuits, among other components. These components are connected internally by one or more busses. As will be discussed in greater detail below, the structure and control of the memory 120 in FIG. 2A can be implemented according to embodiments of the present invention.

A more specific example of a SoC device is depicted with respect to FIG. 2B. FIG. 2B illustrates the basic components as shown in FIG. 2A in more detail. The specific layout in this figure is provided only as an example. Once again, the memory can utilize aspects of the invention.

In low power SoC designs (e.g., devices for mobile platforms or other battery operated devices), high energy efficiency is achieved by operating the devices in various operating point performance (OPP) modes, depending on the workload of the device. In high OPP modes, SoC power supply is kept high or, in some cases, raised above nominal to achieve maximum performance. In low OPP modes, SoC power supply is switched to a lower voltage to reduce power while sustaining the reduced work load on the device.

In an SoC design, it is also desirable to optimize the power consumption and speed of the memory elements. The power consumption of SRAM devices varies widely depending on the type of SRAM and how frequently the cell is accessed. It is desirable to keep the power consumption as low as possible while maximizing the efficiency of the device.

SRAM cells may be mono-supply or dual-rail devices. In mono-supply SRAM, the bit cell array as well as periphery logic inside the SRAM are kept at the same supply voltage ($V_{NOM}$). Consequently, the functional voltage range of a mono-supply SRAM is very narrow, with only small power savings when the SRAM is in standby mode. In a dual-rail SRAM, the bit cell array and peripheral logic are powered by separate power supplies, the array voltage ($V_{ARRAY}$) and the peripheral voltage ($V_{PERI}$), respectively. $V_{ARRAY}$ is generally kept at $V_{NOM}$ such that static noise margin (SNM) and write margin for the bit cell array are secured. $V_{PERI}$ voltage is generally the same as SoC logic power supply.

Figure 3:
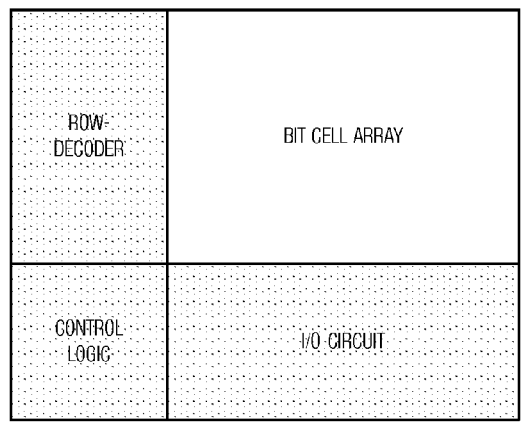
FIG. 3 is an illustration of a dual-rail SRAM of the type illustrated in FIG. 2.

An example of a dual-rail memory is shown with respect to FIG. 3. The cross-hatching represents difference voltage levels between components.

Figure 1:
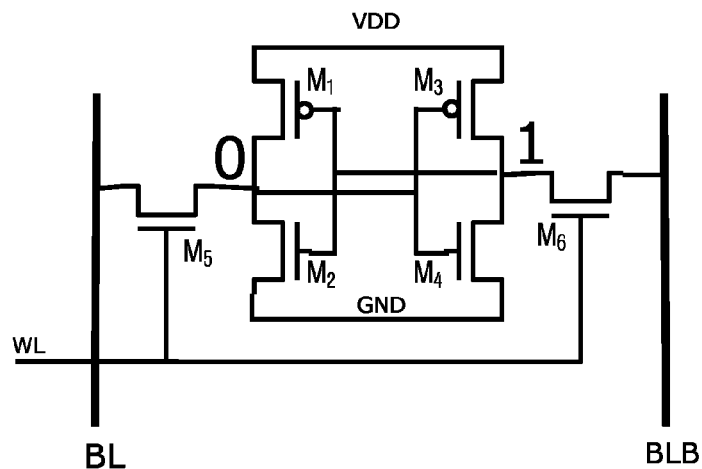
FIG. 1 is a schematic diagram of a known 6T-SRAM device.

As shown, the bit cell array is powered by $V_{ARRAY}$, and the row-decoder, control logic, and I/O circuit are powered by $V_{PERI}$. The bit lines, such as BL and BLB in FIG. 1, are also powered by $V_{PERI}$ in a dual-rail SRAM. With this design, $V_{ARRAY}$ is generally kept constant at nominal voltage ($V_{NOM}$), while $V_{PERI}$ varies in a wider range around $V_{NOM}$.

Accordingly, dual-rail memory provides a wider margin for $V_{PERI}$ being lower (i.e., power savings) compared to mono-supply because bit cell latch stability is high, as it is kept at a higher voltage $V_{ARRAY}$. Compared to a mono-supply SRAM, a dual-rail SRAM achieves efficient power scaling as a major portion of dynamic power which is associated with bit lines charging and discharging with $V_{PERI}$ scaling. However, there is a general need for SRAM cells that meet ever-increasing power scaling demands.

On chip SRAMs also operate in low OPP and high OPP modes. With mono-supply SRAMs, however, the device can only operate in a very narrow voltage range around $V_{NOM}$. Dual-rail SRAMs, because of their separate power supply for $V_{ARRAY}$ and $V_{PERI}$, can operate at a wider voltage range to maximize performance in both low OPP and high OPP modes. With a dual-rail design, $V_{ARRAY}$ is generally kept constant across all OPP modes, while $V_{PERI}$ changes dependent on whether the device is operating at a low OPP or high OPP mode. For instance, in low OPP modes, $V_{PERI}$ is lower than $V_{ARRAY}$, while in high OPP modes, $V_{PERI}$ is high than $V_{ARRAY}$.

SRAM functionality issues are normally encountered when a large difference exists between $V_{ARRAY}$ and $V_{PERI}$. For example, the SRAM device may have a lower specific limit (LSL) constraint and an upper specific limit (USL).

In particular, to achieve power scaling in low OPP mode, the bit line pair must be pre-charged at $V_{PERI}$ so that the majority of SRAM dynamic power, which is associated with charging and discharging the bit lines, scales with $V_{PERI}$. Keeping the bit lines at $V_{PERI}$ puts a serious constraint on the lower limit of $V_{PERI}$ due to read stability of the bit cell.

As $V_{PERI}$ is lowered and $V_{ARRAY}$ remains fixed, the bit cell internal node holding "1" becomes weaker during access. An undesired current starts flowing from this node to the bit lines, which lowers the potential of the internal node holding "1". Below a certain value of $V_{PERI}$, called Vmin_peri, an unwanted flipping of the bit cell may occur. As a result, an unwanted write may take place, thereby corrupting memory contents.

When the SRAM is operating in high OPP modes, the device may face the upper specific limit (USL). In high OPP modes, $V_{PERI}$ is higher than $V_{ARRAY}$. Due to the power scaling requirement in low OPP mode, the bit lines are kept at $V_{PERI}$. During high OPP mode, a constraint on the upper limit of $V_{PERI}$ occurs due to bit cell stability in the read mode. As $V_{PERI}$ increases while keeping $V_{ARRAY}$ fixed, ground bounce voltage increases at the bit cell internal node holding "0" during access. Above a certain value of $V_{PERI}$, called Vmax_peri, unwanted flipping of the bit cell may occur. In this case, $V_{PERI}$ is restricted to Vmax_peri to ensure stability of the cell.

Some currently used SRAM devices limit the power supply range, which restricts the potential maximum power and/or performance gain of the entire chip. One approach to enabling wide voltage difference in $V_{ARRAY}$ and $V_{PERI}$ is to keep the bit lines at $V_{ARRAY}$. In other words, the bit lines are pre-charged (PCH) at $V_{ARRAY}$. When the bit lines and the array are at the same voltage, i.e., $V_{ARRAY}$, then there is no bit cell instability during access. In this case, level shifters may be inserted at very early stage of clock and signal path and hence, most of the SRAM logic gets shifted to $V_{ARRAY}$.

Figure 4:
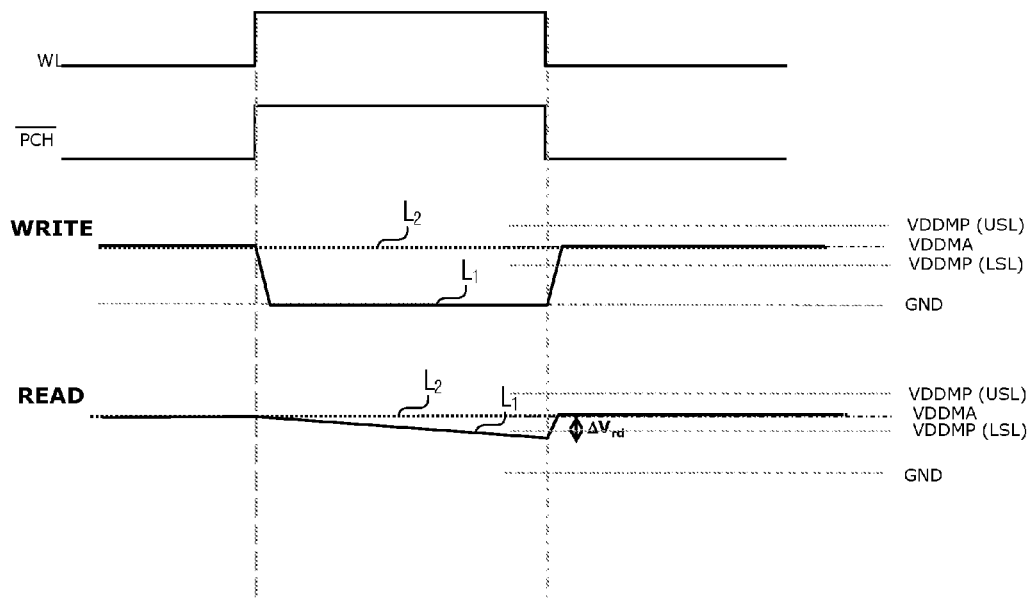
FIG. 4 is a timing diagram for operation of a dual-rail SRAM.

A timing diagram for operation of a conventional dual-rail SRAM is shown with respect to FIG. 4. The first two lines of the timing diagram show the control signals WL and PCH/. The signal WL controls the word line to be active high while the pre-charge and equalization signal PCH/ controls the pre-charge circuitry. Since the pre-charge signal PCH/ is active low, the access signal WL and pre-charge signal PCH/ will change states relatively close together in time.

During both a write operation and a read operation, which are shown in the next two lines as alternatives for operation, the bit lines BL and BLB are pre-charged to $V_{ARRAY}$. With respect to read and write operations, the dotted line $L_2$ represents the voltage of the bit line BLB and the solid line $L_1$ represents the voltage of the bit line BL, or vice versa depending on whether a logical one or zero is being written to or read from the cell.

Various limits are shown in the timing diagram with respect to $V_{PERI}$ and $V_{ARRAY}$. For instance, VDDMP (USL) represents $V_{MAX\_PERI}$ with the upper specific limit constraint, while VDDMP (LSL) represents $V_{MIN\_PERI}$ with the lower specific limit constraint. To ensure stable operation, the bit lines should be pre-charged to a value between $V_{MIN\_PERI}$ and $V_{MAX\_PERI}$. Further, GND denotes ground and VDDMA corresponds to the array voltage $V_{ARRAY}$.

In this example, the power (µW/MHz) of the write cycle is a function of the equation:

$$P = C_{BL} \times V_{array}^2 \qquad (1),$$

where $C_{BL}$ is the capacitance of the bit line BL (or complementary bit line BLB). For example, if $C_{BL}$ is 100 ff and $V_{ARRAY}$ is 1.0 V, the power, P, will be 1 nW/MHz.

The power of the read cycle is a function of the equation:

$$P = C_{BL} \times \Delta V_{rd} \times V_{array} \qquad (2),$$

where $\Delta V_{rd}$ is the difference between the pre-charge voltage $V_{ARRAY}$ and the voltage at which a low state can be recognized. A drawback to the SRAM operation shown in FIG. 4 is that dynamic power scaling of memory may be poor with respect to $V_{PERI}$ lowering.

Various embodiments of the present invention provide a circuit arrangement and a method thereof to prevent degradation of performance when the SRAM operates with wide voltage differences between $V_{ARRAY}$ and $V_{PERI}$. Each bit line is associated with a $V_{PERI}$ pre-charge circuit as well as a $V_{ARRAY}$ pre-charge circuit. With an illustrative embodiment, an access sequence of $V_{ARRAY}$ and $V_{PERI}$ pre-charge circuits enables a wider $V_{ARRAY}$ and $V_{PERI}$ difference in dual-rail memory devices.

Figure 5:
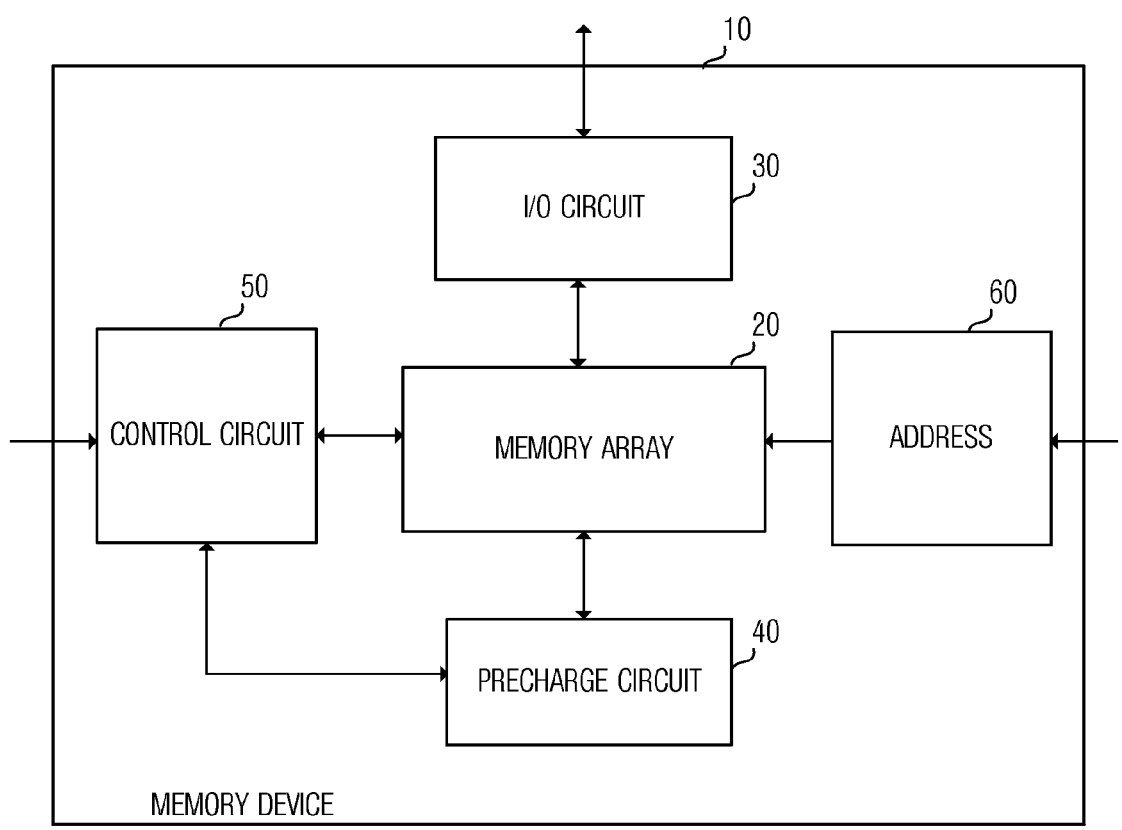
FIG. 5 is a block diagram of an embodiment of a SRAM device with pre-charge circuitry.

Referring to FIG. 5, a memory device 10 is shown with a memory array 20, input/output (I/O) circuitry 30, pre-charge circuitry 40, control circuitry 50, and address circuitry 60. In some embodiments, the memory device 10 may be integrated into a system on a chip (or other integrated circuit) and in other cases the memory device 10 may be a stand-alone integrated circuit.

The memory array 20 includes rows and columns of memory cells, e.g., 6T SRAM cells as shown in FIG. 1. In other embodiments, other types of memory such as dynamic random access memory (DRAM) or non-volatile memory can be used. The memory array 20 can have anywhere from about 1000 memory cells to millions of memory cells. These cells will be addressed one or more at a time by address circuitry 60, which can include a row decoder and column decoder. Data will be written into and read out of the memory array 20 through the I/O circuitry 30. All of these and more operations can occur under the control of control circuitry 50. Details of these circuits are known and will not be provided here.

As illustrated, the I/O circuit 30, the pre-charge circuit 40, and the control circuit 50 comprise peripheral circuitry for the memory device 10. In other examples, the peripheral circuitry may include components in addition to, or in place of, the ones shown. As discussed above and as shown in FIG. 3, the peripheral circuitry can operate with a variable voltage supply while the memory array operates with a constant array voltage supply. In other embodiments, the peripheral voltage is constant, but different than the array voltage.

In this embodiment, the memory array 20 (i.e., the bit cell array) may have a plurality of bit cells connected by the bit line BL and/or the complementary bit line BLB. For example, a 6T SRAM cell will be coupled to both the bit line BL and the complementary bit line BLB, while a DRAM cell will be coupled to only one of the bit line BL or the complementary bit line BLB. The memory array 20 also includes a plurality of word lines. The bit cells in the memory array 20 may be arranged in rows and columns with each row of memory cells coupled to a respective bit line. Each column may be coupled to a respective word line.

The pre-charge circuitry 40 includes circuitry to pre-charge and equalize the bit lines BL and BLB to $V_{PERI}$ as well as circuitry to pulse pre-charge the bit lines BL and BLB to a voltage level that is static noise margin (SNM) safe, such as $V_{ARRAY}$ or a voltage less than $V_{ARRAY}$. In this example, $V_{PERI}$ is lower than $V_{ARRAY}$. When $V_{PERI}$ is higher than $V_{ARRAY}$, the precharge circuitry 40 will pre-charge the device to $V_{ARRAY}$.

When a memory cell in the memory array 20 is in a standby state, the voltage of the bit lines is $V_{PERI}$. While in read or write mode, the voltage is pulsed to $V_{ARRAY}$ or whichever SNM safe voltage level is being used. The switch from $V_{PERI}$ to $V_{ARRAY}$, or vice versa, is initiated by the control circuit 50.

In this illustrative example, control circuit 50 is configured to access a selected memory cell in the memory array 20. The control circuit 50 then causes the bit line of the selected memory cell to be pre-charged to $V_{PERI}$. In response to an access request received by the I/O circuit 30, the control circuit 50 is further configured to cause the bit line to be pre-charged to $V_{ARRAY}$.

Figure 6:
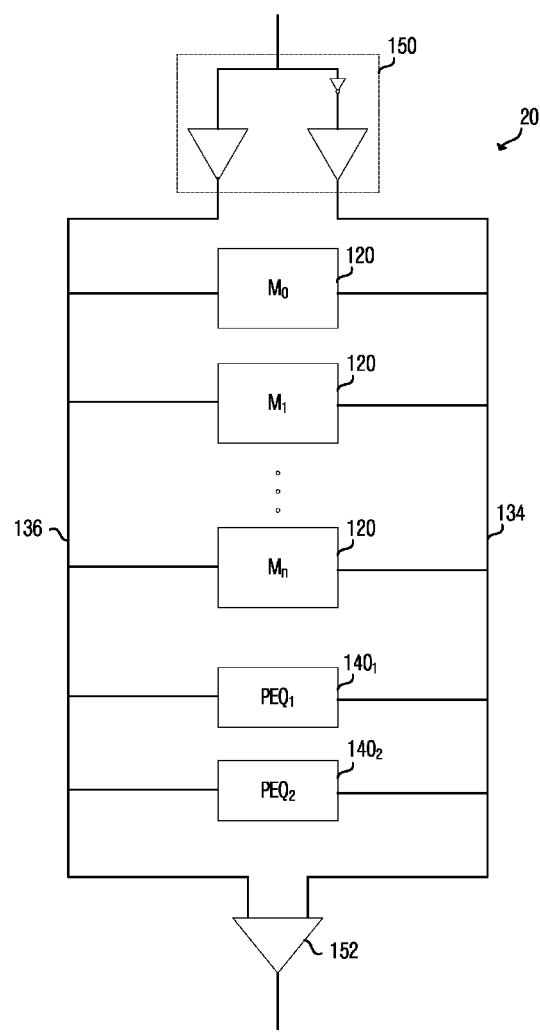
FIG. 6 is an illustration of a portion of a memory array.

FIG. 6 illustrates one example of a portion of memory array 20. In particular, portions of two bit lines BL 136 and BLB 134 are shown. For the purpose of illustration, a drive circuit 150 and amplifier circuit 152 are shown as well. These circuits can be used to provide information to and receive information, respectively, from the bit lines.

A number of memory cells 120 are coupled between the bit line BL 136 and the complementary bit line BLB 134. As discussed above and as shown in more detail in FIGS. 7A and 7B, each of the memory cells can be a 6T SRAM cell. As also discussed herein, other types of memory cells can be used in this array.

In the embodiment of FIG. 6, the pre-charge and equalization circuit 140 includes two portions $140_1$ and $140_2$. The first pre-charge equalization circuit $140_1$ is used to pre-charge the bit lines BL 136 and BLB 134 to the peripheral voltage, e.g., when the peripheral voltage is less than the array voltage. The second pre-charge and equalization circuit $140_2$ can then be used to pre-charge the bit lines BL 136 and BLB 134 to the array voltage. As discussed above, other voltage levels that provide optimum power and timing performance can be used. The following examples will refer to the array and periphery voltages with this understanding in mind. In this manner, power will be saved because the bit lines are only being pre-charged to the lower power thereby saving power.

Figure 7A:
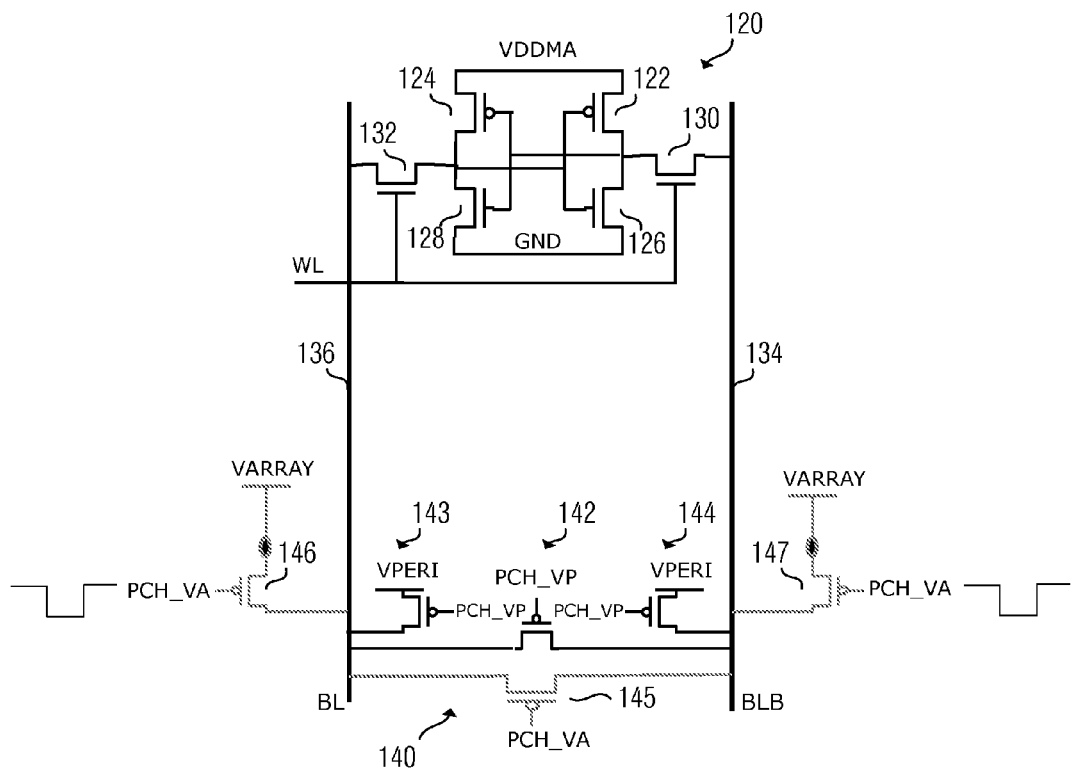
FIGS. 7A and 7B, is a schematic diagram of an embodiment of a SRAM device with pre-charge circuitry and a corresponding timing diagram for the SRAM device.

This concept will be explained in greater detail with respect to the circuit of FIG. 7, which includes FIGS. 7A and 7B. FIG. 7A shows only a single bit cell 120 of the memory device, which is coupled between the bit lines BL 136 and BLB 134 and is illustrated as a six transistor SRAM cell in this example. In other embodiments, the bit cell 120 may include more or less transistors, depending on the functionality involved.

The memory cell itself includes pull up transistors 122 and 124 and pull down transistors 126 and 128. These transistors are coupled to the bit lines via access transistors 130 and 132. During operation, a data bit is written into the memory cell 120 by first activating the access transistors 130 and 132 and then driving the bit line pair with complementary voltage levels, e.g., the bit line BL 136 being high and the complementary bit line BLB 134 being low or vice versa. In this manner, the inverter formed by transistors 124 and 128 will be driven to a first level while the inverter formed by transistors 122 one 126 would be driven to the opposite level. Since the inverters are cross coupled, the particular data bit will be latched. The latched data can then be read out by once again activating the access transistors and then sensing the voltage difference between the bit line and the complementary bit line. An example of the timing of this operation will be described below with respect to FIG. 7B.

The pre-charge circuitry 140 is also depicted in FIG. 7A. In this example, the first pre-charge portion $140_1$ (illustrated in FIG. 6) includes transistors 142, 143, and 144. The second pre-charge portion $140_2$ (also illustrated in FIG. 6) includes transistors 145, 146, and 147. During operation, one of the pre-charge portions will be functional during the pre-charge cycle. For example, when pre-charging to the peripheral voltage $V_{PERI}$ the pre-charge signal PCH_VP will be activated (low in this case) to cause all three transistors 142, 143, and 144 to be conductive. As a result, the transistor 143 will pull the bit line BL 136 to the peripheral voltage and the transistor 144 will pull the complementary bit line BLB 134 to the same peripheral voltage. At the same time, the equalization transistor 142 will couple the bit lines together so that they will both be at a voltage level of about the peripheral voltage $V_{PERI}$. The second portion of the pre-charge circuitry will operate in a similar manner except that the bit lines will be pulled to the array voltage $V_{ARRAY}$.

In this example, each of the transistors in the pre-charge circuitry 140 is a PMOS transistor. Alternatively, NMOS transistors could be used. In that case, the transistors would be active high (and would need to be activated with a gate voltage high enough to pass through the desired voltages $V_{PERI}$ or $V_{ARRAY}$). In other embodiments, other technology transistors or switches could be used.

Various embodiments also include a control circuit, such as the control circuit 50 shown in FIG. 5, which controls the operation of the pre-charging equalization circuitry 140. For example, this circuitry will generate the control signals PCH_VP and PCH_VA. In one embodiment, the signals PCH_VP and PCH_VA are generated at their respective supply levels, e.g., $V_{PERI}$ or $V_{ARRAY}$. In another embodiment, these signals can be generated at supply level that is the maximum of $V_{PERI}$ and $V_{ARRAY}$, to avoid any cross supply leakage current possibilities.

Figure 7B:
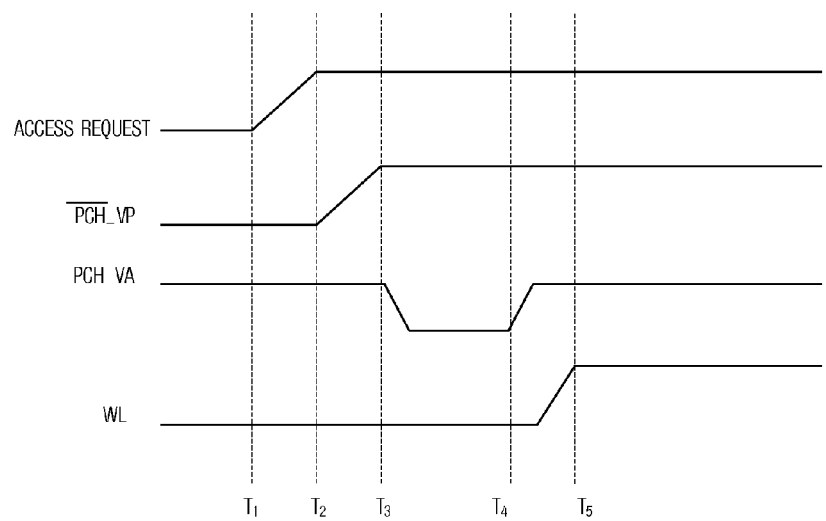

FIG. 7B illustrates a timing diagram which corresponds to the operation of the memory circuit shown in FIG. 7A. During the initial stage, the bit lines BL 136 and BLB 134 are pre-charged to the peripheral voltage $V_{PERI}$. To accomplish this, the pre-charge signal PCH_VP is active while the pre-charge signal PCH_VA is inactive. The word line WL is also inactive so that the memory cells are isolated from the pre-charge of the bit lines.

This example assumes that $V_{PERI}$ is lower than $V_{ARRAY}$. In modes where $V_{ARRAY}$ is lower than $V_{PERI}$, power could be saved by having the bit lines pre-charged to $V_{ARRAY}$, as shown, e.g., in FIG. 4, for example. In other embodiments, the bit lines are pre-charged to $V_{PERI}$ regardless of whether $V_{PERI}$ is higher than or lower than $V_{ARRAY}$.

As depicted, the control circuit receives an access request at time $T_1$. At time $T_2$, the control circuit deactivates the first pre-charge portion $140_1$ by raising the pre-charge signal PCH_VP. At time $T_3$, the second portion $140_2$ of the pre-charge circuit 140 is activated by setting the pre-charge signal PCH_VA to an active low level thereby turning on transistors 145, 146, and 147. The time between $T_2$ and $T_3$ can be very small to the point that $T_2$ and $T_3$ can be the same time. One goal would be to ensure that the transistors 143 and 144 are off before transistors 146 and 147 turn on to avoid a current leakage path between the two supply voltages $V_{ARRAY}$ and $V_{PERI}$.

The second portion of the pre-charge circuitry 140 will remain active long enough to pre-charge the bit lines BL 136 and BLB 134 to the array voltage. As will be discussed below, this time can be determined based upon the difference between the two voltages $V_{ARRAY}$ and $V_{PERI}$ and the capacitance of each bit line. In this manner, the bit lines will be pre-charged to a low voltage to save power and only be raised to the higher voltage upon operation. This higher voltage level will ensure proper operation of the memory cell while the lower voltage will help to save power being consumed by the chip.

After the bit lines are pre-charged to the array voltage, the second portion $140_2$ of the pre-charge circuitry can be deactivated at time $T_4$ and the word line can be activated at time $T_5$. Once the read or write function is completed, the first portion $140_1$ pre-charge circuit 140 is activated, thereby returning the voltage of bit lines BL 136 and BLB 134 to $V_{PERI}$.

As shown in the timing diagram, the second precharge circuit precharges the bit lines to a level which is SNM safe for the selected bit cell. The second precharge circuit can be deactivated by control logic whenever voltage difference between $V_{ARRAY}$ and $V_{PERI}$ is within a SNM safe range, to avoid any timing or power penalty. The word line activation delay can also be linked to a PCH_VA pulse generation circuit so that the word line activates only after the bit lines have reached a SNM safe level.

In this example, the first voltage level is lower than the second voltage level. In some embodiments, the first voltage level may be higher than the second voltage level.

Figure 8A:
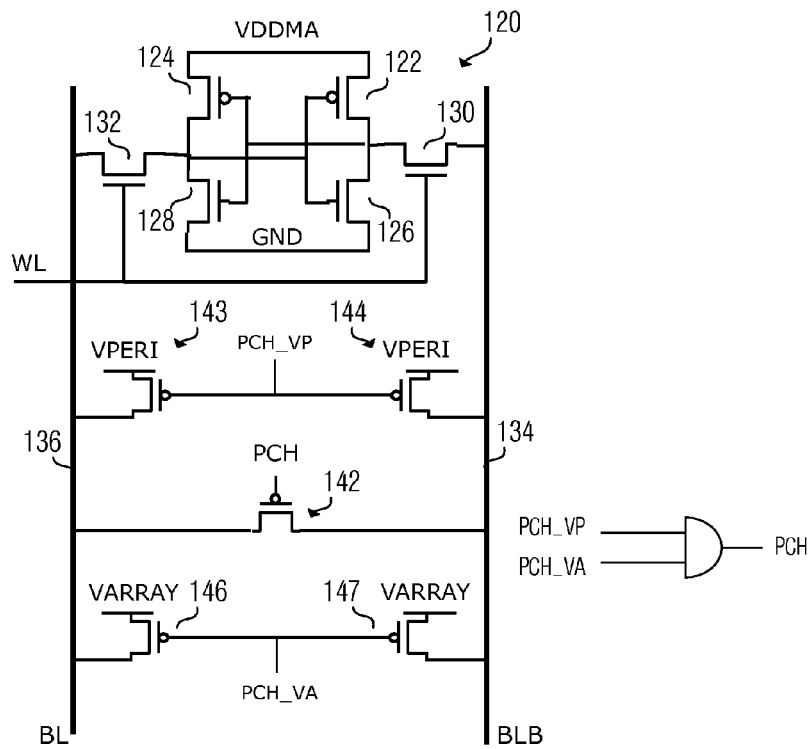
FIGS. 8A and 8B, is another schematic diagram of an embodiment of a SRAM device with pre-charge circuitry and a corresponding timing diagram for the SRAM device.
Figure 8B:
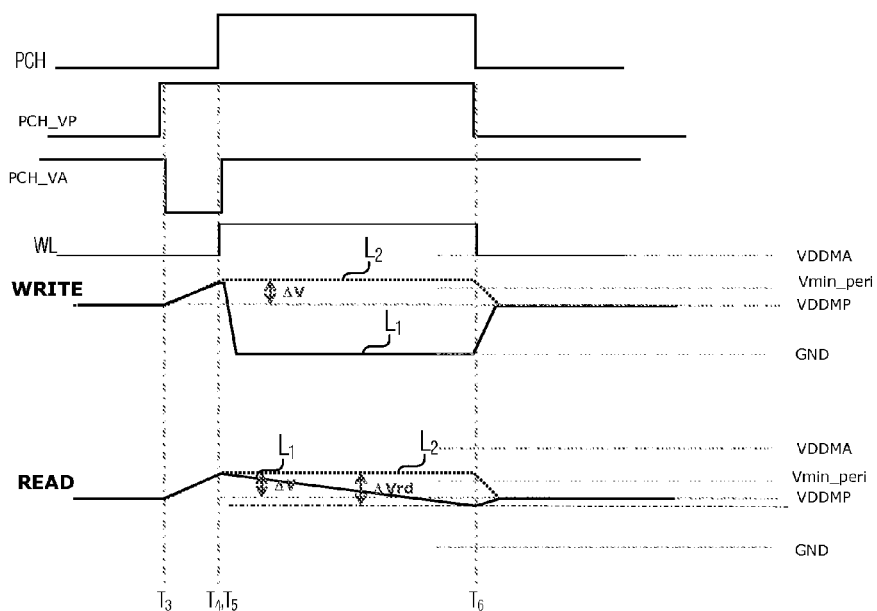

FIG. 8 illustrates an alternative embodiment, where FIG. 8A shows the circuitry and FIG. 8B shows a timing diagram. In this example, a single equalization transistor 142 (or 145) is provided. This equalization transistor will be controlled by a pre-charge signal PCH, which is active when either the peripheral voltage pre-charge signal PCH_VP is active or the array voltage pre-charge signal PCH_VA is active. The advantage of this embodiment is the elimination of one transistor for each pre-charge circuit but at the expense of slightly more complicated control since a third pre-charge signal must be obtained. In one embodiment, the pre-charge signal PCH can be obtained at the output of an AND gate that has the peripheral voltage pre-charge signal PCH_VP and the array voltage pre-charge signal PCH_VA as the inputs.

The timing diagram is shown in FIG. 8B, where the memory device 10 is operating in low OPP mode, i.e., where $V_{PERI}$ is lower than $V_{ARRAY}$. The memory cells within the memory device 10 are powered by a supply voltage of $V_{ARRAY}$, while the peripheral circuitry adjacent to the memory cells is powered at $V_{PERI}$. This operation is similar to that described with respect to FIG. 7.

The timing diagram in this illustration shows the voltage of the bit line BL 136 and the bit line BLB 134 during a write cycle or during read cycle. (Of course, they both will not happen at the same time for this cell. The write and read cycles will happen sequentially in time.) The voltage of the bit line BL 136 is depicted with referenced to line $L_1$, while the voltage of the bit line BLB 134 is depicted with reference to dotted line $L_2$, or vice versa, depending on whether a high or low voltage is being written into or read from the cell.

In this example, before time $T_3$, the pre-charge signals PCH and PCH_VP are activated and the pre-charge signal PCH_VA is deactivated. This will cause transistors 142, 143, and 144 to turn on to pre-charge the bit lines BL 136 and BLB 134 to the first voltage level $V_{PERI}$. At time $T_3$, in response to an access request, the pre-charge signal PCH_VP is deactivated and the pre-charge signal PCH_VA is activated while pre-charge signal PCH remains active. This signaling causes transistors 142, 146, and 147 to pre-charge and equalize the bit lines BL 136 and BLB 134 to the second voltage level $V_{ARRAY}$. This increase in pre-charge voltage can be seen in the increase in voltage in the read and write lines of the timing diagram.

At time $T_4$, the pre-charge signals are all deactivated and, shortly thereafter at time $T_5$, the word lines WL begin operation to access the memory cell 120. At this time, a bit can be written into or read from the memory cell as indicated by the separation of $L_1$ and $L_2$ in the read and write lines of the timing diagram. After one cycle of operation, at time $T_6$, the bit lines BL 136 and BLB 134 are returned to the first voltage level $V_{PERI}$ using the pre-charge circuitry. The operation is now ready to begin another read or write cycle.

During the write cycle, the bit lines BL 136 and BLB 134 are pre-charged to $V_{PERI}$. After $T_5$, the voltage in the bit line BLB 134 remains substantially constant, while the voltage in the bit line BL 136 drops to ground. At time $T_6$, the voltage of bit line BLB 134 gradually decreases as the voltage of bit line BL 136 increases back to $V_{PERI}$.

With the use of an illustrative embodiment, the power (μW/MHz) of the write cycle is a function of the equation:

$$P = 2C_{BL} \times \Delta V \times V_{array} \quad (3),$$

where $C_{BL}$ is the capacitance of the bit line and $\Delta V$ is the difference between the voltage of the bit line BLB 134 after pulse precharge and $V_{PERI}$. It is not necessary to precharge the bit lines to Varray completely but level of bit lines must be raised above Vmin_peri. The power of the return phase, or the time when the voltage returns to $V_{PERI}$ after a write cycle, for the bit line BLB 134 is a function of the equation:

$$P = -C_{BL} \times \Delta V \times V_{peri} \quad (4),$$

while the power of the return phase for the bit line BL is a function of the equation:

$$P = C_{BL} \times V_{peri}^2 \quad (5).$$

Therefore, the power usage of an entire write cycle is a function of the equation:

$$P = 2C_{BL} \times \Delta V \times V_{array} + C_{BL} \times V_{peri}^2 - C_{BL} \times \Delta V \times V_{peri} \quad (6).$$

During the read cycle, the bit lines BL 136 and BLB 134 are initially pre-charged to $V_{PERI}$. Between $T_3$ and $T_5$, the bit lines are raised by $\Delta V$, which is equal to more than Vmin_peri. At time $T_5$ voltage of BL 136 starts to decrease due to bitcell read current while voltage of BLB 134 remains almost constant. At time $T_6$, WL is deactivated and Vperi precharge is turned on.

With the use of an illustrative embodiment, the power (μW/MHz) of the read cycle is a function of the equation:

$$P = 2C_{BL} \times \Delta V \times V_{array} \quad (7).$$

The return power during recovery phase, or the time when the voltage returns to $V_{PERI}$ after a read cycle, for the bit line BLB 134 is a function of the equation:

$$P = -C_{BL} \times \Delta V \times V_{peri} \quad (8),$$

while the power of the return phase for the bit line BL 136 is a function of the equation:

$$P = C_{BL} \times (\Delta V_{rd} - \Delta V) \times V_{peri} \quad (9),$$

where $\Delta V_{rd}$ represents the voltage difference that can be sensed for a read operation (since the voltage of the low line does not heed to be pulled all the way to ground before the difference signal is sensed). Therefore, the power usage of an entire read cycle is a function of the equation:

$$P = 2C_{BL} \times \Delta V \times V_{array} + C_{BL} \times (\Delta V_{rd} - \Delta V) \times V_{peri} - C_{BL} \times \Delta V \times V_{peri} \quad (10).$$

Accordingly, with the use of an illustrative embodiment in either the read or the write cycle during low OPP modes, power savings may be realized. For instance, if $C_{BL}$ is 100 ff, $V_{ARRAY}$ is 1.0 V, $V_{PERI}$ is 0.6 V, and $\Delta V$ is 150 mV, the power will be 0.57 nW/MHz, or a 43% reduction in power using equation (6) as compared to the example in equation (1). Assuming the same parameters as the write cycle and adding $\Delta V_{rd}$ as 400 mV, the power of the read cycle will be 0.36 nW/MHz, or a 10% reduction in power usage with equation (10) as compared to the example in equation (2). Of course, this is only one example of values for each of the aforementioned parameters and other values, as well as rates of reduction, may be realized.

One or more of the components shown with reference to FIGS. 6-8 may be used with a memory device in a system on a chip. For example, the memory device 10 shown in FIG. 7 may be used as the SRAM device depicted in the system on chip of FIG. 2. As an example, in one embodiment, the memory cells of the memory device 10 may be disposed in a common substrate with a processor. In this example, the process is powered by $V_{PERI}$ and may be set to different voltage levels in different modes. The memory cells are powered by $V_{ARRAY}$, as described above.

When $V_{PERI}$ is less than $V_{ARRAY}$ by more than a specified margin, control logic is configured to control the first pre-charge circuit 70 to pre-charge a selected bit line to $V_{PERI}$. Subsequently, before the word lines WL should be accessed, the control logic controls the second pre-charge circuit 80 to pre-charge the selected bit line to $V_{ARRAY}$ or at least a voltage above Vmin_peri. When $V_{PERI}$ is not less than Vmin_peri, the selected bit line may be kept pre-charged to $V_{PERI}$. In this case, the word lines WL may be activated without pre-charging the selected bit line to the array voltage first. When $V_{PERI}$ is more than $V_{ARRAY}$ but less than Vmax_peri, the bit lines can be kept precharged to $V_{ARRAY}$ and $V_{PERI}$ precharge circuit can be kept deactivated by control logic.

Figure 9:
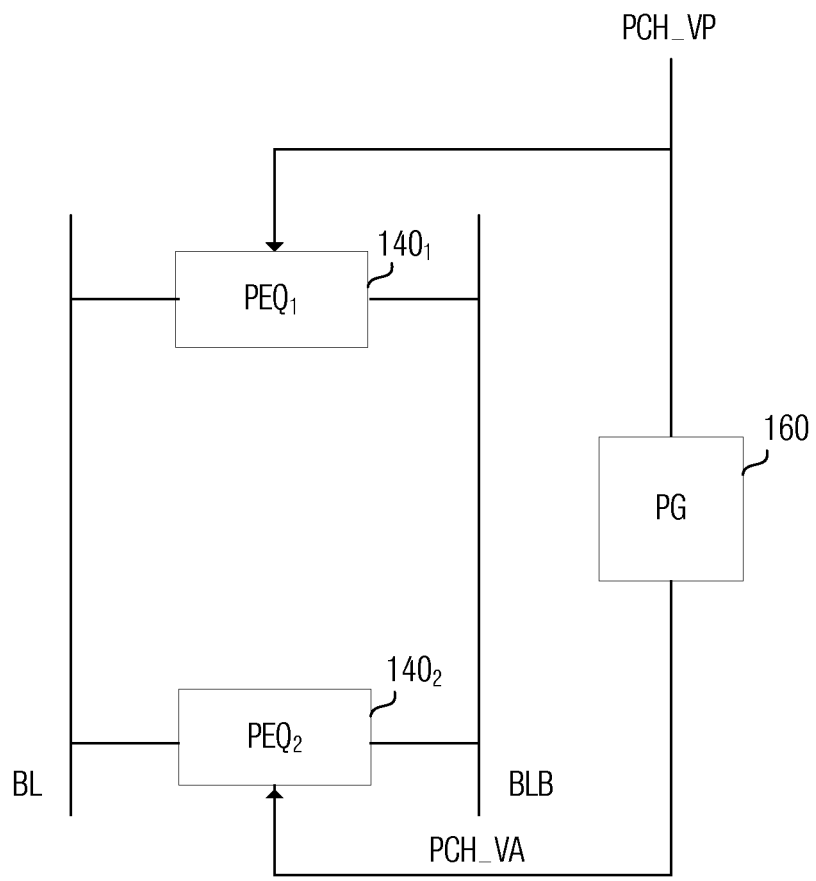
FIG. 9 is a schematic diagram of an embodiment of a SRAM device.

Generation of the second pre-charge signal PCH_VA will now be described with respect to FIG. 9, which shows a portion of the memory device 10 of FIG. 6. In other words, this circuit could be applied to either of the embodiments of FIGS. 7 and 8 as well as other circuits. As in FIG. 6, the pre-charge and equalization circuits 140$_1$ and 140$_2$ are coupled between the bit lines BL 136 and BLB 134. The pre-charge control signal PCH_VP is provided to circuit 140$_1$ and the pre-charge control signal PCH_VA is provided to circuit 140$_2$. In the embodiment of FIG. 7, the equalization circuits 140$_1$ and 140$_2$ are transistors. In other embodiments, other circuits could be used.

In this embodiment, the array voltage pre-charge signal PCH_VA is generated from the peripheral voltage pre-charge signal PCH_VP, which can be generated by the control circuitry. Of course, the pulse generator 160 is also part of the control circuitry. During operation, the pre-charge signal PCH_VP is initially active low. The pulse generator 160 generates a low-going pulse upon detection of a rising edge in the pre-charge signal PCH_VP. This low-going pulse is the active portion of the pre-charge signal PCH_VA.

Figure 10A:
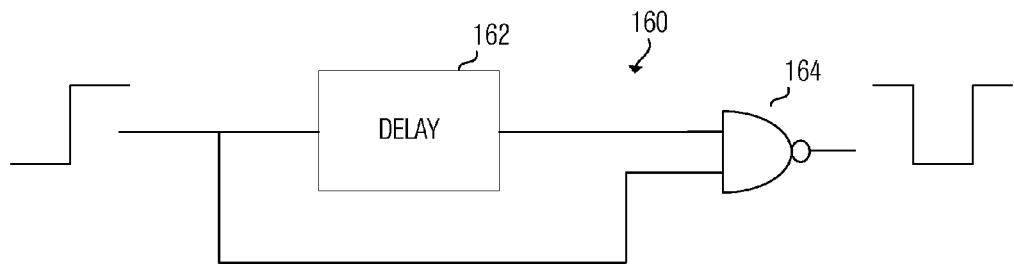
FIGS. 10A and 10B, is an illustration of delay circuits for a SRAM device.
Figure 10B:
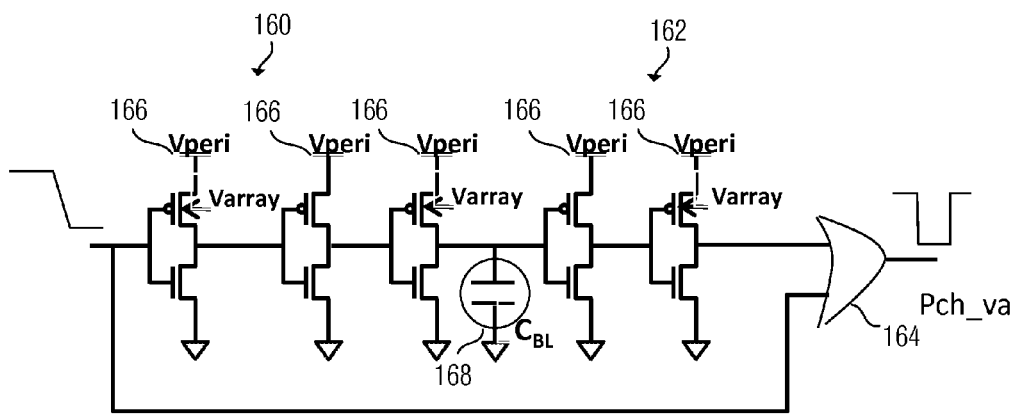

As noted above, the length of the pre-charge pulse VCH_VA is preferably long enough to charge the bit lines to the desired voltage but no longer (to save time). FIG. 10, which includes FIGS. 10A and 10B, illustrates a circuit that can be used to accomplish this goal.

Referring to FIG. 10A, the pulse generator circuit 160 includes a logic gate 164 and a delay element 162. The logic gate 164 has a first input coupled to the input of the first portion of the pre-charge circuit 140 and an output coupled to the input of the second pre-charge portion of the circuit 140 as shown in FIG. 9. The logic gate 164 is a NAND gate in this embodiment. The delay element 162 is selected to have a delay of the length desired for the pulse PCH_VA.

FIG. 10B illustrates one example of an element used to achieve this delay. The delay element 162 includes a string of serially connected inverters 166 with a capacitive element 168 coupled between the output of one of the inverters 166 and an input of another of the inverters 166. In other embodiments, the capacitive element can be distributed into a number of capacitive elements either in parallel and/or between different pairs of the inverters. Although the delay element 162 is shown with five inverters 166 in this example, other numbers of inverters also may be present.

In this particular example, each of the inverters 166 has a p-channel transistor coupled in series with an n-channel transistor between a first voltage node and a ground node. The first voltage node may carry $V_{PERI}$. Ones of the inverters 166 also includes a body node of the p-channel transistors coupled to a second voltage node that may carry $V_{ARRAY}$. In one embodiment, the capacitive element 168 has a capacitive value based upon the capacitance of the bit line BL 136 or the bit line BLB 134.

It is noted that the embodiment of FIG. 10B has been illustrated to detect a falling edge while the embodiment of FIG. 10A detects a rising edge. In particular, the NAND gate 164 of FIG. 10A was replaced with an OR gate in FIG. 10B. These alternatives are illustrated to demonstrate that the concepts described herein apply to either situation.

Figure 11:
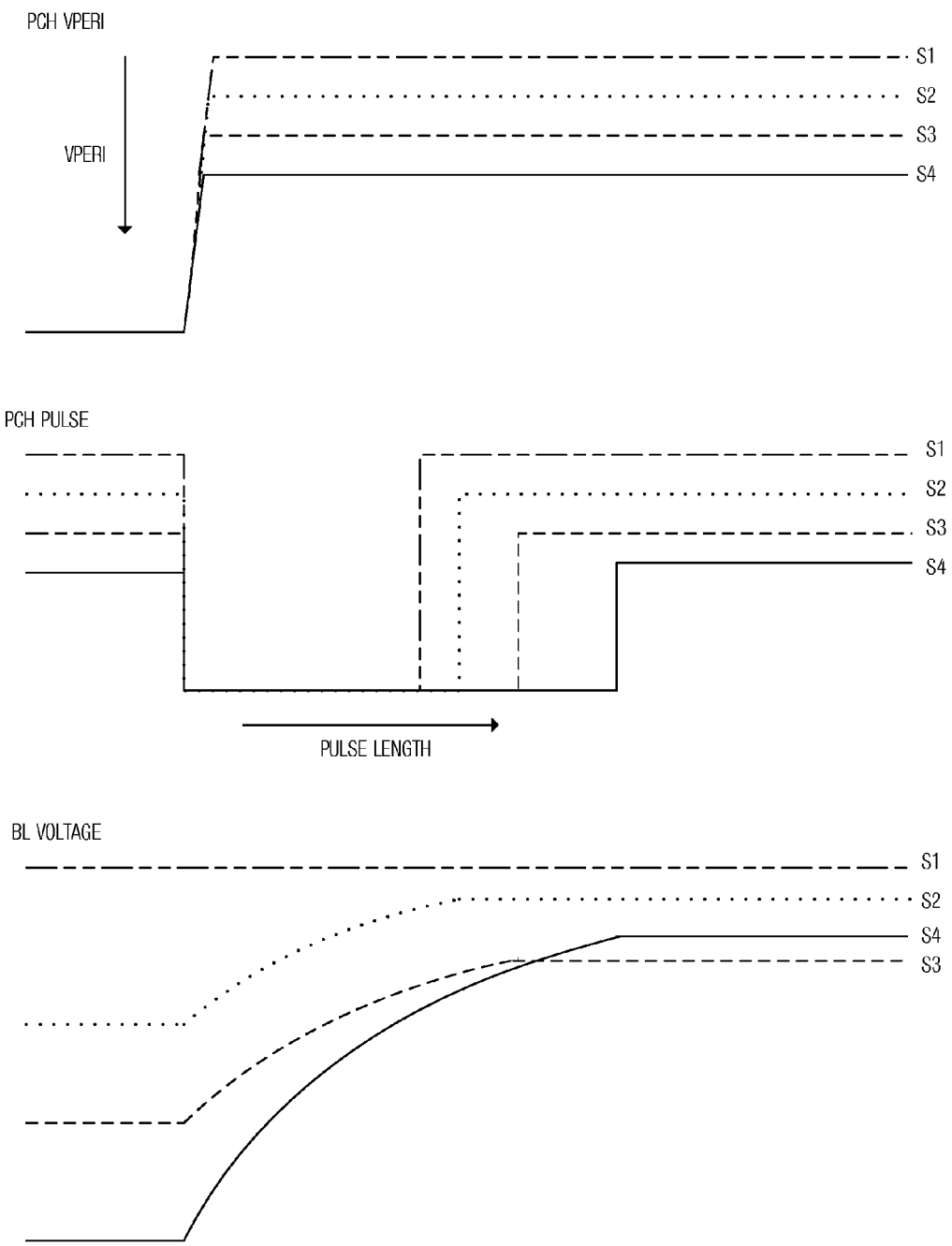
FIG. 11 is a timing diagram of four different operating scenarios in various low operating point performance modes.

FIG. 11 shows a timing diagram of four different operating scenarios with reference to $V_{PERI}$, the $V_{ARRAY}$ pulse, and the voltage of the bit line BL 136. In scenario S1, $V_{PERI}$ is equal to $V_{ARRAY}$. In scenarios S2-S4, $V_{PERI}$ is less than $V_{ARRAY}$. In each case, it is assumed that the bit line capacitance $C_{BL}$ is the same.

The comparison between $V_{PERI}$, $V_{ARRAY}$, and the voltage of the bit line BL 136 shows the different lengths of the $V_{ARRAY}$ pulse relative to the difference between $V_{PERI}$ and $V_{ARRAY}$. As illustrated, the pulse length corresponding to the activation of the second portion of the pre-charge circuit 140 increases as the difference between $V_{PERI}$ and $V_{ARRAY}$ increases. In other words, as the difference between $V_{PERI}$ and $V_{ARRAY}$ increases, it takes longer for the bit line voltage to reach $V_{ARRAY}$ and therefore, it needs a longer time for the word lines WL to begin operation. Conversely, as $V_{PERI}$ approaches $V_{ARRAY}$, the pulse lengths become shorter. The word line activation delay can also be linked to a PCH_VA pulse generated by such circuit so that WL activates only after the bit line voltage has reached SNM safe level.

The illustrations and timing diagrams of various embodiments in FIGS. 6-11 exemplify operation of the present invention in low OPP modes. Similar implementation, in general, should remain valid for high OPP modes, where Vperi is more than Vmax_peri. In high OPP modes where Vperi is less than Vmax_peri, where the use of an illustrative embodiment is not needed, the bit lines BL 136 and BLB 134 are pre-charged at $V_{ARRAY}$ in the standby (i.e., idle) state. The control logic in the memory device 10 may turn off $V_{PERI}$ pre-charge and $V_{ARRAY}$ pre-charge to take control of bit line pre-charge. Therefore, any timing penalty due to the delay element 162 may be reduced in high OPP modes.

Various embodiments of the present invention provide a memory device that may be pre-charged to a peripheral voltage lower than the LSL of some conventional dual-rail memory systems operating in low OPP mode. Additionally, an illustrative embodiment provides a memory device that consumes less power in low OPP mode than memory devices which pre-charge bit lines to $V_{ARRAY}$. The illustrative embodiments also reduce power consumption on $V_{ARRAY}$.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A memory device comprising:
   a bit line;
   a complementary bit line;
   a memory cell coupled to the bit line or the complementary bit line;

a first pre-charge circuit coupled between the bit line and the complementary bit line, the first pre-charge circuit being configured to pre-charge the bit line and the complementary bit line to a first voltage level, wherein the first voltage level comprises a peripheral voltage level;

a second pre-charge circuit coupled between the bit line and the complementary bit line, the second pre-charge circuit being configured to pre-charge the bit line and the complementary bit line to a second voltage level that is different than the first voltage level, wherein the second voltage level comprises an array voltage level;

control circuitry configured to activate the first pre-charge circuit to pre-charge the bit line and complementary bit line to the first voltage level in response to an access request, the access request enabling the second pre-charge circuit to pre-charge the bit line and complementary bit line to the second voltage level only when the peripheral voltage level is lower than the array voltage level and the access request disabling the second pre-charge circuit for charging when the peripheral voltage is higher than the array voltage by a noise margin safe range; and a delay generation circuit coupled to the control circuitry and configured to control a delay so that the memory cell is selected after the bit line and complementary bit line have reached a static noise margin safe level.

2. The memory device of claim 1, wherein the memory cell is coupled between the bit line and the complementary bit line.

3. The memory device of claim 2, wherein the memory cell comprises a static random access memory (SRAM) cell.

4. The memory device of claim 3, wherein the memory cell comprises a six transistor SRAM cell.

5. The memory device of claim 1, wherein the first pre-charge circuit comprises a first transistor with a current path coupled between the bit line and the complementary bit line.

6. The memory device of claim 5, wherein the first pre-charge circuit further comprises:
   a second transistor with a current path coupled between the bit line and a first power supply configured to carry the first voltage level; and
   a third transistor with a current path coupled between the complementary bit line and the first power supply.

7. The memory device of claim 6, wherein the second pre-charge circuit comprises:
   a fourth transistor with a current path coupled between the bit line and the complementary bit line;
   a fifth transistor with a current path coupled between the bit line and a second power supply configured to carry the second voltage level; and
   a sixth transistor with a current path coupled between the complementary bit line and the second power supply.

8. The memory device of claim 7, wherein the first, second and third transistors are each coupled so that a respective control terminal of the transistor is activated at the first voltage level and the fourth, fifth and sixth transistors are each coupled so that a respective control terminal of the transistor is activated at the second voltage level.

9. The memory device of claim 7, wherein the first, second and third transistors and the fourth, fifth and sixth transistors all are coupled so that a respective control terminal of each transistor is activated at a voltage level that is greater of the first voltage level and the second voltage level.

10. The memory device of claim 1, wherein the control circuitry is configured to, at a first time, activate the first pre-charge circuit and, after the first time, deactivate the first pre-charge circuit and activate the second pre-charge circuit.

11. The memory device of claim 1, wherein the peripheral voltage level is at a first level at a first time and a second level at a second time.

12. The memory device of claim 1, wherein the delay generation circuit is coupled between a control input of the first pre-charge circuit and a control input of the second pre-charge circuit.

13. The memory device of claim 12, wherein the delay generation circuit comprises a pulse generator.

14. The memory device of claim 13, wherein the control circuitry is configured to activate the first pre-charge circuit in response to the access request and configured to activate the second pre-charge circuit in response to the pulse generator so that a word line of a selected memory cell activates only after the bit line and complementary bit line have reached the static noise margin safe level.

15. The memory device of claim 13, wherein the delay generation circuit comprises:
   a logic gate with a first input coupled to the control input of the first pre-charge circuit and an output coupled to the control input of the second pre-charge circuit; and
   a delay element with an input coupled to the input of the first pre-charge circuit and an output coupled to a second input of the logic gate.

16. The memory device of claim 15, wherein the delay element comprises:
   a string of serially coupled inverters, each inverter having an input and an output, the input of a first inverter in the string coupled to the input of the first pre-charge circuit and the output of a last inverter in the string coupled to the second input of the logic gate; and
   a capacitive element coupled between the output of one of the inverters and an input of another one of the inverters.

17. The memory device of claim 16, wherein:
   each inverter comprises a p-channel transistor coupled in series with an n-channel transistor between a node configured to carry the peripheral voltage level and a ground node;
   a body node of one or more of the p-channel transistors is coupled to a node configured to carry the array voltage level; and
   the capacitive element has a capacitive value based upon a capacitance of the bit line or the complementary bit line.

18. An integrated circuit comprising:
   an array of memory cells arranged in rows and columns, each column of memory cells coupled to a respective bit line and each row of memory cells being coupled to a respective word line;
   peripheral circuitry adjacent the memory cells;
   an array voltage node coupled to provide power to the array;
   a peripheral voltage node coupled to provide power to the peripheral circuitry; and
   control circuitry configured to access a selected memory cell in the array, the control circuitry configured to cause the bit line of the selected memory cell to first be pre-charged to the peripheral voltage using a first-precharge circuit and then, in response to an access request and a determination that the peripheral voltage is lower than the array voltage, to be pre-charged to the array voltage using a second pre-charge circuit, wherein the control circuitry includes a delay circuit that is configured to generate a delay so that the selected word line activates only after the selected bit line has reached a static noise margin safe level.

19. The integrated circuit of claim 18, wherein the control circuitry is configured to activate the word line of the selected memory cell after the bit line of the selected memory cell has reached a static noise margin safe level.

20. The integrated circuit of claim 18, wherein the peripheral circuitry comprises decoder circuitry, control logic and input/output circuit coupled to the array of memory cells.

21. The integrated circuit of claim 20, wherein the integrated circuit comprises a system on a chip and the peripheral circuitry comprises a processor.

22. The integrated circuit of claim 18, wherein the array comprises an array of static random access memory (SRAM) cells, each SRAM cell coupled between the respective bit line and a respective complementary bit line, the control circuitry configured to cause the bit line and the complementary bit line of the selected memory cell to be pre-charged to the same level.

23. The integrated circuit of claim 18, wherein each column of the array further comprises:
a first pre-charge circuit coupled the bit line, the first pre-charge circuit being configured to pre-charge the bit line to the peripheral voltage; and
a second pre-charge circuit coupled to the bit line, the second pre-charge circuit being configured to pre-charge the bit line to the array voltage.

24. A system on a chip comprising:
processing circuitry powered by a peripheral voltage, the peripheral voltage configured to be set to different voltage levels in different modes;
a plurality of static random access memory (SRAM) cells arranged in rows and columns, each column of SRAM cells coupled between a respective bit line and complementary bit line and each row of SRAM cells being coupled to a respective word line, each SRAM cell powered by an array voltage;
for each column, a first pre-charge circuit coupled between the bit line and the complementary bit line, the first pre-charge circuit being configured to pre-charge the bit line and the complementary bit line to the peripheral voltage;
a second pre-charge circuit coupled between the bit line and the complementary bit line, the second pre-charge circuit being configured to pre-charge the bit line and the complementary bit line to a voltage that is static noise margin safe for a selected SRAM cell; and
a control circuit configured to:
receive an access request of a selected memory cell that is coupled a selected bit line, a selected complementary bit line and a selected word line;
when the peripheral voltage is less than the array voltage by more than a margin, using the first pre-charge circuit to pre-charge the selected bit line and selected complementary bit line to the peripheral voltage and then pre-charge the selected bit line and selected complementary bit line to the array voltage and then activate the selected word line; and
when the peripheral voltage is not less than the array voltage by more than the margin, using the second pre-charge circuit to pre-charge the selected bit line and the selected complementary bit line to the array voltage and then activate the selected word line;
wherein the control circuit includes a delay circuit that is configured to generate a delay so that the selected word line activates only after the selected bit line has reached a static noise margin safe level.

25. The system on a chip of claim 24, wherein the margin is zero.

26. The system on a chip of claim 24, wherein the control circuit comprises a delay generation circuit coupled between a control input of the first pre-charge circuit and a control input of the second pre-charge circuit, the delay generation circuit comprising:
a logic gate with a first input coupled to the input of the first pre-charge circuit and an output coupled to the input of the second pre-charge circuit; and
a delay element with an input coupled to the input of the first pre-charge circuit and an output coupled to a second input of the logic gate.

27. The system on a chip of claim 26, wherein:
the delay element comprises a string of serially coupled inverters, each inverter having an input and an output, the input of a first inverter in the string coupled to the input of the first pre-charge circuit and the output of a last inverter in the string coupled to the second input of the logic gate;
each inverter comprises a p-channel transistor coupled in series within an n-channel transistor between a node configured to carry the peripheral voltage and a ground node;
a body node of one or more of the p-channel transistors is coupled to a node configured to carry the array voltage;
the delay element further comprises a capacitive element coupled between the output of one of the inverters and an input of another one of the inverters; and
the capacitive element has a capacitive value based upon a capacitance of the bit line or the complementary bit line.

28. A method of accessing a memory cell that is disposed in a common substrate with a processor, the processor being powered by a peripheral voltage that is configured to be set to different voltage levels in different modes, the memory cell powered by an array voltage, the method comprising:
receiving an access request to write to or read from the memory cell, the memory cell being coupled a selected bit line and a selected word line;
when the peripheral voltage is less than the array voltage by more than a margin, pre-charging the selected bit line to the peripheral voltage and then pre-charging the selected bit line to the array voltage and then activating the selected word line; and
when the peripheral voltage is not less than the array voltage by more than the margin, pre-charging the selected bit line to the array voltage and then activating the selected word line without pre-charging the selected bit line to the array voltage.

29. A method of operating a system-on-chip device in a number of operating point performance (OPP) modes, the system-on-chip device including a memory and a processor disposed in a common substrate, the method comprising:
during a first time period, operating the system-on-chip device in a low OPP mode; and
during a second time period, operating the system-on-chip device in a high OPP mode;
wherein operating the system-on-chip device in the low OPP mode comprises:
applying a first peripheral voltage to the processor; and
while the first peripheral voltage is applied to the processor, accessing a memory cell of the memory by first activating a pre-charge of a bit line coupled the memory cell to the first peripheral voltage during a standby mode, then deactivating the pre-charge of the bit line from the first peripheral voltage and activating a pre-charge of the bit line to an array voltage, and then deactivating the pre-charge of the bit line from the array voltage and reading from or writing to the memory cell; and wherein operating the system-on-chip device in the high OPP mode comprises:

applying a second peripheral voltage to the processor, the second peripheral voltage being greater than the first peripheral voltage; and while the second peripheral voltage is applied to the processor, accessing a memory cell of the memory by activating a pre-charge of the bit line to the array voltage during the standby mode and then, in response to an access request, deactivating the pre-charge of the bit line to the array voltage and reading from or writing to the memory cell.

30. The method of claim 29, wherein the array voltage is greater than the first peripheral voltage and wherein the second peripheral voltage is greater than the array voltage.

31. The method of claim 29, wherein the memory includes peripheral circuitry that is powered by the first peripheral voltage in the low OPP mode and is powered by the second peripheral voltage in the high OPP mode.

\* \* \* \* \*